(12) United States Patent
Abe (10) Patent No.: US 8,785,993 B2
(45) Date of Patent: Jul. 22, 2014

(54) SOLID-STATE IMAGING ELEMENT, MANUFACTURING METHOD, AND ELECTRONIC DEVICE

(75) Inventor: Takashi Abe, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/564,030

(22) Filed: Aug. 1, 2012

(65) Prior Publication Data
US 2013/0037900 A1 Feb. 14, 2013

(30) Foreign Application Priority Data

Aug. 12, 2011 (JP) ................................ 2011-176721

(51) Int. Cl.
*H01L 31/06* (2012.01)
*H01L 21/00* (2006.01)

(52) U.S. Cl.
USPC ...................... 257/292; 257/E31.001; 438/73

(58) Field of Classification Search
None
See application file for complete search history.

(56) References Cited

U.S. PATENT DOCUMENTS 5,378,641 A * 1/1995 Cheffings ...................... 438/302
2009/0221136 A1* 9/2009 Krueger et al. ............... 438/513
2009/0242949 A1* 10/2009 Adkisson et al. ............. 257/292

FOREIGN PATENT DOCUMENTS

JP 2005-167588 A * 6/2005
JP 2010-016114 1/2010

* cited by examiner

*Primary Examiner* — Michael Lebentritt
*Assistant Examiner* — Kevin Quinto
(74) *Attorney, Agent, or Firm* — Sheridan Ross P.C.

(57) ABSTRACT

A solid-state imaging element includes a pixel having a photoelectric conversion section and a side pinning layer. The photoelectric conversion section is formed in a semiconductor substrate. The side pinning layer is formed on a side of the photoelectric conversion section. The side pinning layer is formed by performing ion implantation in a state of a trench being open, the trench being formed in a part on a side of a region in which the photoelectric conversion section is formed.

19 Claims, 9 Drawing Sheets

SOLID-STATE IMAGING ELEMENT, MANUFACTURING METHOD, AND ELECTRONIC DEVICE

BACKGROUND

The present disclosure relates to a solid-state imaging element, a manufacturing method, and an electronic device, and particularly to a solid-state imaging element, a manufacturing method, and an electronic device that can improve image quality more.

In related art, solid-state imaging elements such as CMOS (Complementary Metal Oxide Semiconductor) image sensors, CCD (Charge Coupled Device) image sensors, and the like are widely used in digital still cameras, digital video cameras, and the like. A solid-state imaging element has a light receiving surface in which a plurality of pixels having a PD (photodiode) as a photoelectric conversion section, a plurality of transistors, and the like are arranged two-dimensionally. Each of the pixels subjects incident light to photoelectric conversion.

For example, in a CMOS image sensor, a charge accumulated by photoelectric conversion in a PD is transferred to an FD (Floating Diffusion) as a floating diffusion region via a transfer transistor. Then, the charge accumulated in the FD is converted into a pixel signal corresponding to the level of the charge by an amplifying transistor, and the pixel signal is output via a selecting transistor.

In general, a saturation charge amount by which a charge can be accumulated in the PD is determined by parameters such as the area (that is, a physical area and depth) of the PD, the potential depth of the PD, an electric field between a surface pinning layer formed on the surface of the PD and the PD, and the like.

The area of the PD is determined by the size of the pixel (cell size), a plurality of transistors possessed by the pixel, a pixel separating section for separating the pixel, and the like. In addition, the physical depth of the PD and the potential depth of the PD are determined by ease of readout of a charge from the PD to the FD. In addition, an electric field between the PD and the surface pinning layer forms a PN junction capacitance, and an accumulable charge can be increased according to the intensity of the electric field even with a same potential difference. However, the electric field of too high intensity becomes a source of a leakage. Thus, the electric field is determined by a tradeoff in relation to the occurrence of the leakage.

The saturation charge amount of the PD is thus determined by a plurality of factors. However, it is difficult to simply increase the saturation charge amount because of limitations in terms of characteristics.

Japanese Patent Laid-Open No. 2010-16114 (referred to as Patent Document 1 hereinafter) discloses for example a technology that intensifies an electric field at a side wall of a PD by forming a PN junction capacitance on the side of a trench element isolation region, and which technology thereby increases the saturation charge amount of the PD.

SUMMARY

There has recently been a tendency to miniaturize pixels and reduce the area of PDs as the number of pixels of a solid-state imaging element is increased. As described above, a reduction in area of a PD decreases the saturation charge amount, and thus causes a degradation in the image quality of the solid-state imaging element such as a decrease in dynamic range, for example.

There is thus a desire to suppress a degradation in image quality of the solid-state imaging element and improve the image quality by increasing the saturation charge amount of the PD as pixels tend to be miniaturized.

The present disclosure has been made in view of such a situation, and is to make it possible to improve image quality more.

According to an embodiment of the present disclosure, there is provided a solid-state imaging element including: a pixel having a photoelectric conversion section formed in a semiconductor substrate, and a side pinning layer formed on a side of the photoelectric conversion section, wherein the side pinning layer is formed by performing ion implantation in a state of a trench being open, the trench being formed in a part on a side of a region in which the photoelectric conversion section is formed.

According to an embodiment of the present disclosure, there is provided a method for manufacturing a solid-state imaging element, the solid-state imaging element including a pixel having a photoelectric conversion section formed in a semiconductor substrate and a side pinning layer formed on a side of the photoelectric conversion section. The method include: forming a trench in a part on a side of a region in which the photoelectric conversion section is formed; and forming the side pinning layer by performing ion implantation in a state of the trench being open.

According to an embodiment of the present disclosure, there is provided an electronic device including: a solid-state imaging element having a pixel including a photoelectric conversion section formed in a semiconductor substrate, and a side pinning layer formed on a side of the photoelectric conversion section, wherein the side pinning layer is formed by performing ion implantation in a state of a trench being open, the trench being formed in a part on a side of a region in which the photoelectric conversion section is formed.

In an embodiment of the present disclosure, a side pinning layer is formed on a side of a photoelectric conversion section by performing ion implantation in a state of a trench being open, the trench being formed in a part on a side of a region in which the photoelectric conversion section is formed.

According to an embodiment of the present disclosure, image quality can be improved more.

DETAILED DESCRIPTION OF THE PREFERRED EMBODIMENTS

A concrete embodiment to which the present technology is applied will hereinafter be described in detail with reference to the drawings.

Figure 1:
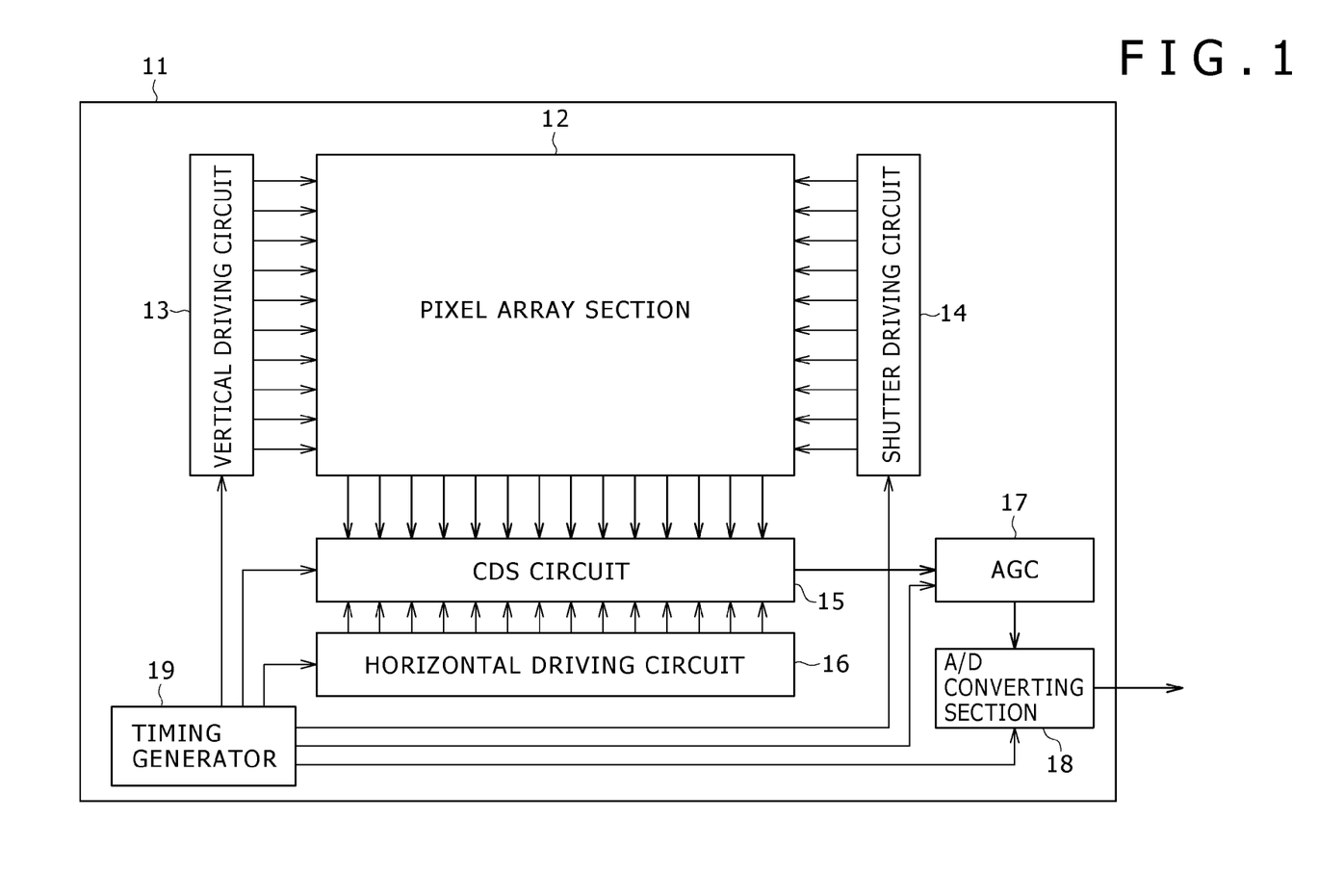
FIG. 1 is a block diagram showing an example of configuration of one embodiment of a solid-state imaging element to which the present technology is applied.

FIG. 1 is a block diagram showing an example of configuration of one embodiment of a solid-state imaging element to which the present technology is applied.

A solid-state imaging element 11 in FIG. 1 is a CMOS type solid-state imaging element. The solid-state imaging element 11 includes a pixel array section 12, a vertical driving circuit 13, a shutter driving circuit 14, a CDS (Correlated Double Sampling) circuit 15, a horizontal driving circuit 16, an AGC (Automatic Gain Controller) 17, an A/D (Analog/Digital) converting section 18, and a timing generator 19.

The pixel array section 12 has a plurality of pixels (pixel 21 in FIG. 2, for example) arranged two-dimensionally. Each pixel has one or a plurality of photoelectric conversion elements. In addition, a plurality of pieces of signal wiring for supplying signals from the vertical driving circuit 13 to each pixel are connected to the respective rows of the pixel array section 12, and a plurality of pieces of signal wiring for outputting a pixel signal from each pixel to the CDS circuit 15 are connected to the respective columns of the pixel array section 12.

The vertical driving circuit 13 sequentially supplies signals for selecting the respective rows of the plurality of pixels possessed by the pixel array section 12 via the signal wiring.

The shutter driving circuit 14 sequentially supplies driving signals for performing shutter driving to the respective rows of the plurality of pixels possessed by the pixel array section 12. The exposure time (charge accumulation time) of the pixels can be adjusted by adjusting an interval between the driving signals output from the shutter driving circuit 14 and the signals output from the vertical driving circuit 13, for example.

The CDS circuit 15 reads pixel signals from pixels of a row selected by a signal from the vertical driving circuit 13, and performs CDS processing. Specifically, the CDS circuit 15 obtains signals indicating pixel values from which fixed pattern noise of the respective pixels is removed by taking differences between pixel signals corresponding to levels at which charges are accumulated in the respective pixels and pixel signals of reset levels of the respective pixels. Then, the CDS circuit 15 sequentially outputs the obtained signals indicating the pixel values to the AGC 17 according to driving signals from the horizontal driving circuit 16.

The horizontal driving circuit 16 outputs, to the CDS circuit 15, the driving signals to select the pixels possessed by the pixel array section 12 in order in a column direction and output the signals indicating the pixel values.

The AGC 17 amplifies the signals indicating the pixel values, which signals are supplied from the CDS circuit 15, with an appropriate gain, and outputs the amplified signals to the A/D converting section 18.

The A/D converting section 18 outputs pixel data obtained by converting the analog signals supplied from the AGC 17 into digital numerical values to the outside of the solid-state imaging element 11.

The timing generator 19 generates signals indicating timing necessary to drive the respective blocks of the solid-state imaging element 11 on the basis of a clock signal of a predetermined frequency, and supplies the signals to the respective blocks.

In FIG. 1, a flow of the signals output from the pixels are indicated by thick line arrows. The signals output from the pixel array section 12 are subjected to CDS processing in the CDS circuit 15, thereafter amplified in the AGC 17, subjected to A/D conversion in the A/D converting section 18, and then output to the outside.

Incidentally, FIG. 1 shows an example of the configuration of the solid-state imaging element 11. It is possible to adopt for example a configuration not including the A/D converting section 18 within the solid-state imaging element 11 or a configuration including an A/D converting section for each column of pixels. In addition, the solid-state imaging element 11 may have a plurality of output systems by having one or more CDS circuits 15 and having a plurality of AGCs 17 and A/D converting sections 18.

Figure 2:
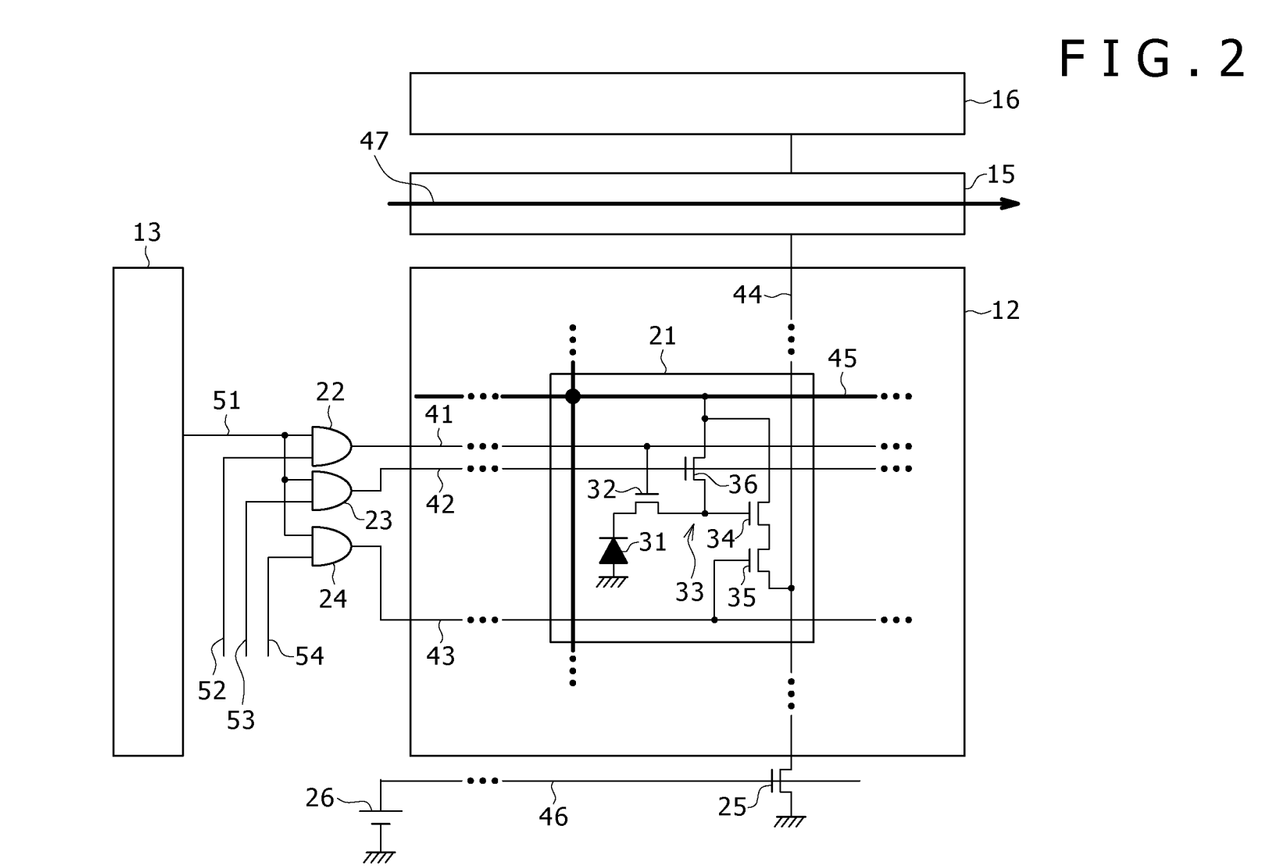
FIG. 2 is a circuit diagram showing an example of configuration of a pixel in a pixel array section and a peripheral circuit.

A pixel of the pixel array section 12 and a peripheral circuit will next be described with reference to FIG. 2.

As described above, the pixel array section 12 has a plurality of pixels arranged two-dimensionally. However, FIG. 2 shows one pixel 21 of these pixels, and does not show the other pixels for simplification. As shown in FIG. 2, the peripheral circuit for the pixel array section 12 includes AND elements 22 to 24 arranged for each row of the pixels 21, a transistor 25 arranged for each column of the pixels 21, and a constant-potential source 26.

The pixel 21 includes a PD 31, a transfer transistor 32, an FD 33, an amplifying transistor 34, a selecting transistor 35, and a reset transistor 36. In addition, the pixel 21 is connected with transfer signal wiring 41 for supplying a signal common to pixels 21 arranged in a row direction, reset signal wiring 42, and selecting signal wiring 43, and is connected with pixel output wiring 44 for outputting a pixel signal to the CDS circuit 15. In addition, the pixel 21 is supplied with a predetermined power supply potential via power supply potential supplying wiring 45.

The PD 31 is a photoelectric conversion element for generating a charge by subjecting light with which the pixel 21 is irradiated to photoelectric conversion, and accumulating the charge.

The transfer transistor 32 transfers the charge accumulated in the PD 31 to the FD 33 according to a transfer signal supplied via the transfer signal wiring 41.

The FD 33 is a floating diffusion region formed at a point of connection between the transfer transistor 32 and the gate electrode of the amplifying transistor 34. The FD 33 temporarily accumulates the charge transferred from the PD 31 via the transfer transistor 32. That is, the potential of the gate electrode of the amplifying transistor 34 is increased according to the charge accumulated in the FD 33.

The amplifying transistor 34 has a drain thereof connected to the power supply potential supplying wiring 45. The amplifying transistor 34 converts the charge accumulated in the FD 33 into a pixel signal having a level corresponding to the potential of the charge, and outputs the pixel signal.

The selecting transistor 35 is supplied with a selecting signal for selecting the pixel 21 to output the pixel signal via the selecting signal wiring 43. The selecting transistor 35 connects the amplifying transistor 34 to the pixel output wiring 44 according to the selecting signal.

The reset transistor 36 has a drain thereof connected to the power supply potential supplying wiring 45. The reset transistor 36 resets the charge accumulated in the FD 33 according to a reset signal supplied via the reset signal wiring 42.

The transistor 25 supplies a constant current to the pixel output wiring 44. That is, a constant current is supplied from the transistor 25 to the amplifying transistor 34 of the pixel 21 selected to output the pixel signal, whereby the amplifying transistor 34 operates as a source follower. A potential having a predetermined certain voltage difference with the gate electrode of the amplifying transistor 34 thereby appears in the pixel output wiring 44.

The constant-potential source 26 supplies a constant potential to the gate electrode of the transistor 25 via constant potential supplying wiring 46 so that the transistor 25 operates in a saturation region to supply a constant current.

The AND element 22 has an output terminal connected to the gate electrode of the transfer transistor 32 via the transfer signal wiring 41. In addition, the AND element 22 has one input terminal connected to the output terminal of the vertical driving circuit 13 via signal wiring 51, and has another input terminal connected to a terminal for outputting a transfer signal in the form of a pulse according to driving timing via signal wiring 52.

The AND element 23 has an output terminal connected to the gate electrode of the reset transistor 36 via the reset signal wiring 42. In addition, the AND element 23 has one input terminal connected to the output terminal of the vertical driving circuit 13 via the signal wiring 51, and has another input terminal connected to a terminal for outputting a reset signal in the form of a pulse according to driving timing via signal wiring 53.

The AND element 24 has an output terminal connected to the gate electrode of the selecting transistor 35 via the selecting signal wiring 43. In addition, the AND element 24 has one input terminal connected to the output terminal of the vertical driving circuit 13 via the signal wiring 51, and has another input terminal connected to a terminal for outputting a selecting signal in the form of a pulse according to driving timing via signal wiring 54.

With such a configuration, in the solid-state imaging element 11, the pixel 21 arranged in the row selected by the vertical driving circuit 13 is supplied with the transfer signal, the reset signal, and the selecting signal via the transfer signal wiring 41, the reset signal wiring 42, and the selecting signal wiring 43, respectively.

The driving signals supplied to the pixel 21 will next be described with reference to FIG. 3.

Figure 3:
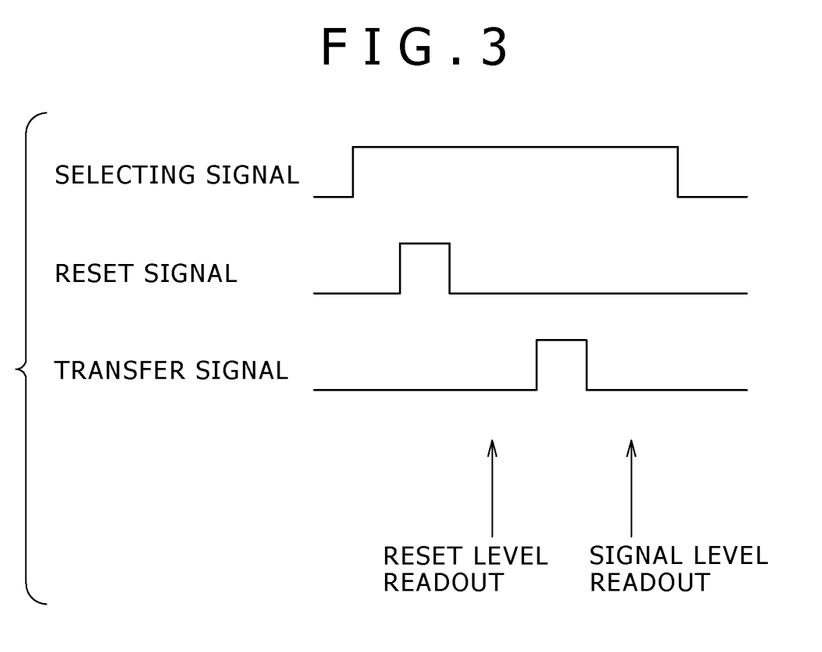
FIG. 3 is a diagram showing an example of driving timing of the pixel.

The selecting signal shown in FIG. 3 is supplied to the selecting transistor 35 via the selecting signal wiring 43. The reset signal is supplied to the reset transistor 36 via the reset signal wiring 42. The transfer signal is supplied to the transfer transistor 32 via the transfer signal wiring 41.

In timing in which a readout period for reading out the pixel signal from the pixel 21 is started, the selecting signal is set to a high level to set the selecting transistor 35 in a conducting state. The signal of the pixel 21 is thereby set in a state of being ready to be output to the CDS circuit 15 via the pixel output wiring 44.

Thereafter, the reset signal is set to a high level to set the reset transistor 36 in a conducting state. The charge accumulated in the FD 33 is thereby reset. Then, the reset signal is set to a low level, whereby the reset transistor 36 is set in a non-conducting state, and thus the reset is completed. A pixel signal at a reset level is thereafter output to the CDS circuit 15.

Next, the transfer signal is set to a high level, whereby the transfer transistor 32 is set in a conducting state, and the charge accumulated in the PD 31 is transferred to the FD 33. Then, the transfer signal is set to a low level, whereby the transfer transistor 32 is set in a non-conducting state, and the transfer of the charge is completed. The pixel signal corresponding to the level of the charge accumulated in the FD 33 is thereafter output to the CDS circuit 15.

Thus, in the solid-state imaging element 11, the pixel signal at the reset level and the pixel signal corresponding to the level of the charge accumulated in the FD 33 are output to the CDS circuit 15. Then, the CDS circuit 15 performs CDS processing, whereby fixed pattern noise caused by variation in threshold voltage of the amplifying transistor 34 in each pixel 21 and the like is cancelled out.

In addition, the CDS circuit 15 outputs the signal indicating the pixel value of the pixel 21 in the column selected by the horizontal driving circuit 16 to the AGC 17 in FIG. 1 via horizontal signal wiring 47.

Figure 4A:
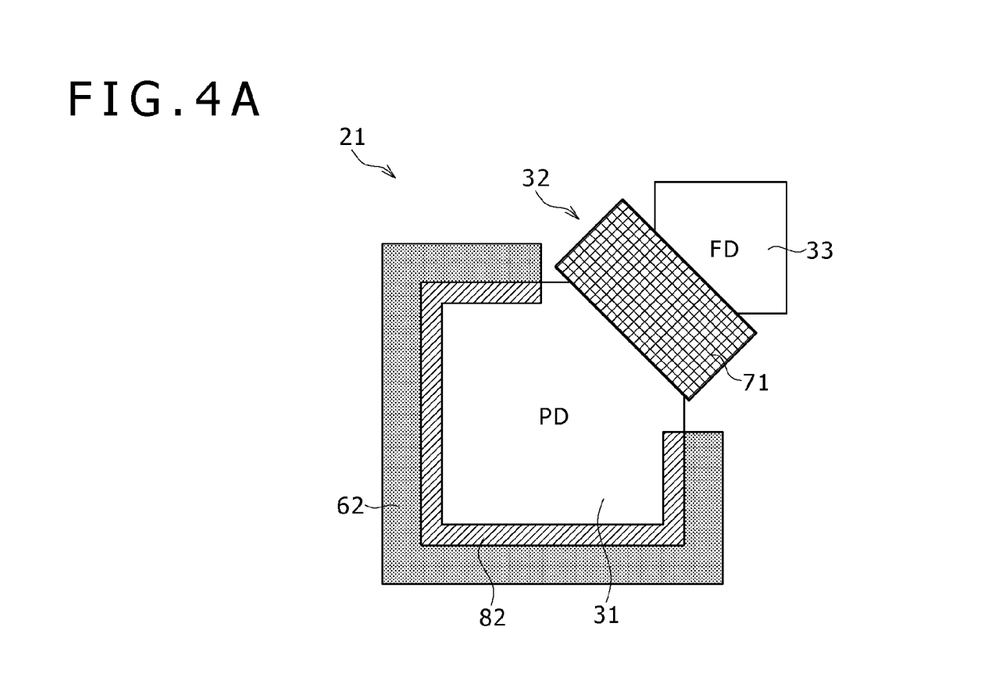
FIGS. 4A and 4B are diagrams showing an example of a planar structure and a sectional structure of the pixel.
Figure 4B:
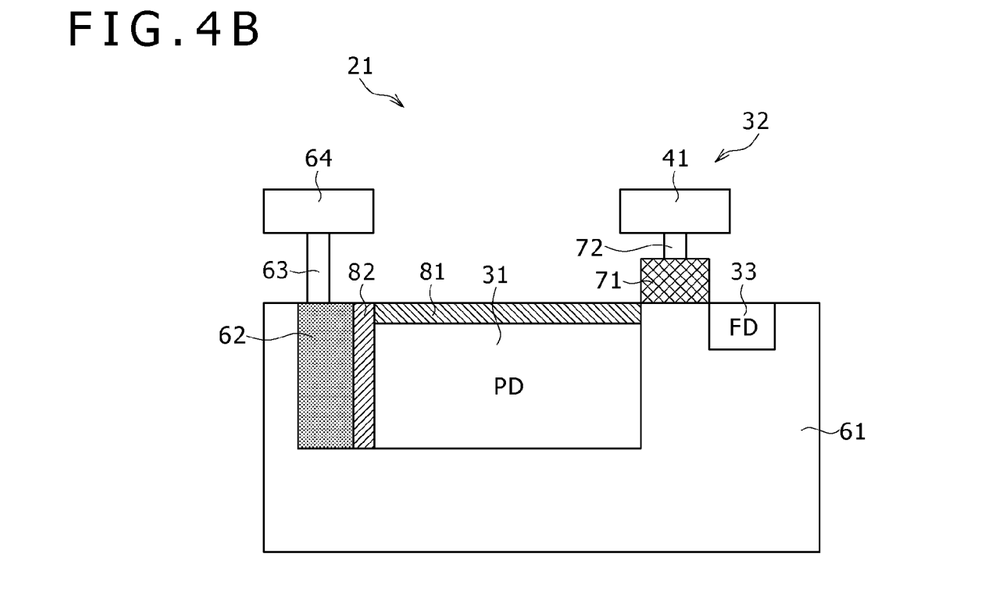

A schematic structure of the pixel 21 possessed by the pixel array section 12 in the solid-state imaging element 11 will next be described with reference to FIGS. 4A and 4B. FIG. 4A shows an example of a planar structure of the pixel 21. FIG. 4B shows an example of a sectional structure of the pixel 21.

As shown in FIG. 4B, the pixel 21 is formed in a silicon substrate 61. The PD 31 is formed in the vicinity of the surface of the silicon substrate 61 (surface facing the upper side of FIG. 4B). The FD 33 is formed at a position separated from the PD 31 with the transfer transistor 32 interposed between the FD 33 and the PD 31.

The PD 31 is for example an N-type region formed by ion implantation of an impurity at a high concentration into the silicon substrate 61 (well) of a P-type.

The transfer transistor 32 is disposed between the PD 31 and the FD 33. The transfer transistor 32 has a gate electrode 71 disposed on the surface of the silicon substrate 61 with an insulating film interposed between the gate electrode 71 and the surface of the silicon substrate 61. In addition, the gate electrode 71 is connected with the transfer signal wiring 41 via a contact part 72. A charge is output from the PD 31 to the FD 33 by applying a voltage to the gate electrode 71.

The FD 33 is formed so as to be in contact with the surface of the silicon substrate 61. The FD 33 is an N-type region of a higher impurity concentration than the PD 31.

In addition, in the pixel 21, a pixel separating section 62 for separating pixels 21 from each other is formed so as to surround sides of the PD 31. The pixel separating section 62 is for example formed by burying polysilicon in a region surrounding the sides of the PD 31 which region does not include a region having the transfer transistor 32 disposed therein. The pixel separating section 62 is fixed at GND in terms of potential by being connected to ground wiring 64 fixed at GND in terms of potential via a contact part 63.

The pixel 21 has a surface pinning layer 81 formed on the surface side of the PD 31, and has a side pinning layer 82 formed at the side part of the PD 31, that is, between the PD 31 and the pixel separating section 62. The surface pinning layer 81 and the side pinning layer 82 are P-type regions of a higher impurity concentration than the silicon substrate 61 (well). The surface pinning layer 81 and the side pinning layer 82 suppress a dark current occurring at boundary surfaces of the silicon. Further, the surface pinning layer 81 and the side pinning layer 82 can increase the saturation charge amount of the PD 31 by a steep PN junction with the PD 31.

Thus, in the pixel 21, the PD 31 and the surface pinning layer 81 form a steep PN junction, and the PD 31 and the side pinning layer 82 similarly form a steep PN junction. Thereby, in the pixel 21, the saturation charge amount of the PD 31 can be increased as compared with a structure in the past in which structure a PN junction is formed only on the surface side of a PD. In addition, the occurrence of a dark current in the pixel 21 can be suppressed more than in the structure in the past.

Thus, in the solid-state imaging element 11 having the pixel 21 of such a structure, it is possible to suppress a decrease in dynamic range and the occurrence of noise due to the dark current, for example, and therefore improve image quality more, even when the pixel 21 is miniaturized, for example.

Figure 5:
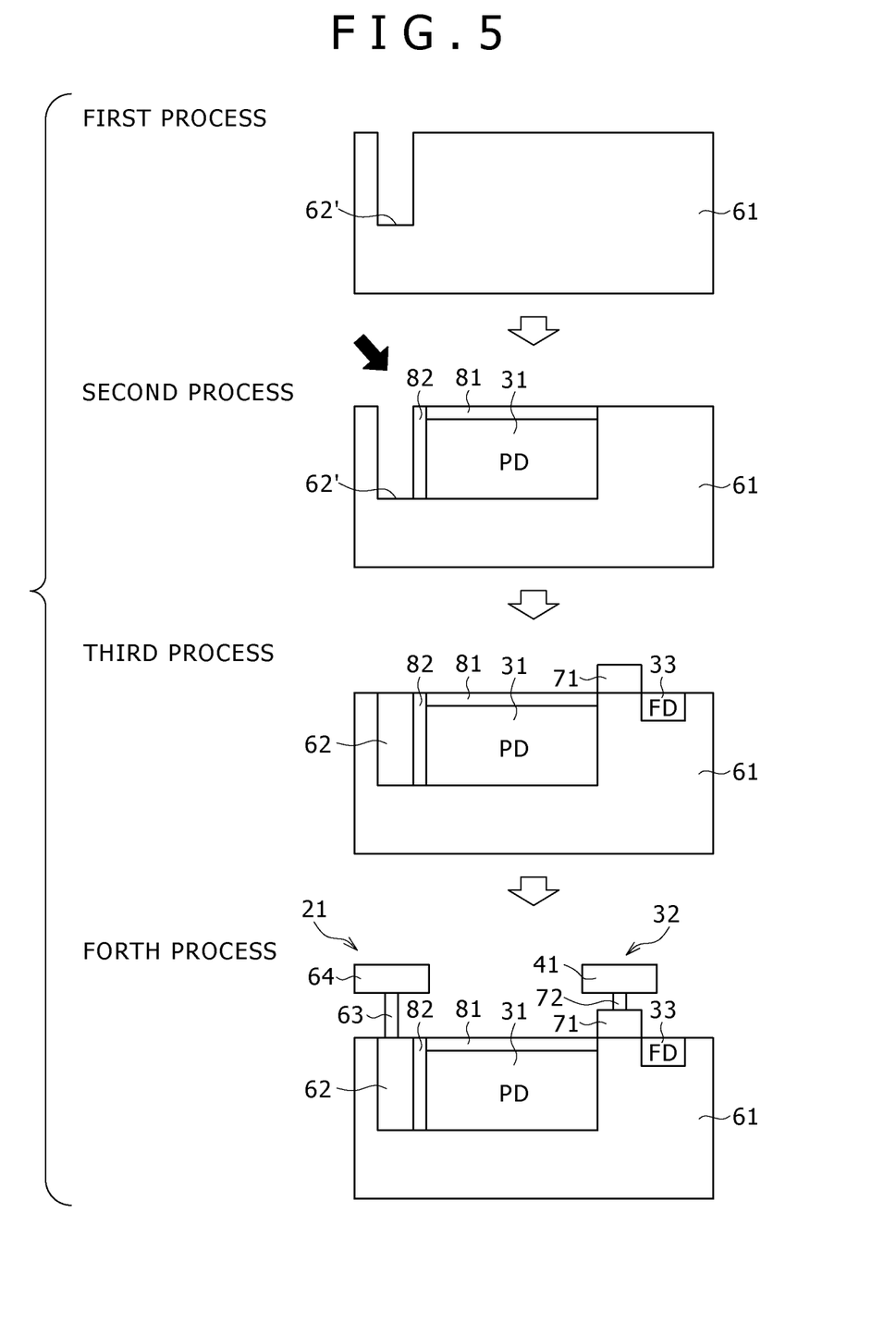
FIG. 5 is a diagram of assistance in explaining processes of manufacturing the pixel.

Processes of manufacturing the pixel 21 will next be described with reference to FIG. 5.

In a first process, a trench 62' is formed in a silicon substrate 61 so as to correspond to a region in which to form a pixel separating section 62. Incidentally, though shown sectionally in FIG. 5, the trench 62' is formed so as to correspond to the pixel separating section 62 shown in FIG. 4A and thus so as to surround a region in which to form a PD 31.

In a second process, the PD 31 is formed by ion implantation of an N-type impurity, and a surface pinning layer 81 and a side pinning layer 82 are formed simultaneously by ion implantation of a P-type impurity.

In this process, as indicated by a black arrow, the ion implantation for forming the surface pinning layer 81 and the side pinning layer 82 is performed from an inclined direction with respect to the surface of the silicon substrate 61. When ion implantation is thus performed from the inclined direction with respect to the surface of the silicon substrate 61 in a state of the trench 62' being open, the side pinning layer 82 forming a steep PN junction similar to that of the surface pinning layer 81 formed on the surface side (direction of depth) of the PD 31 can be formed on the side surface side (lateral direction) of the PD 31.

In addition, the ion implantation for forming the surface pinning layer 81 and the side pinning layer 82 may be performed so as to be inclined with respect to the surface of the silicon substrate 61 from a plurality of directions, for example eight directions, while the silicon substrate 61 is rotated. Thereby, as shown in FIG. 4A, the side pinning layer 82 can be formed on a plurality of sides of the PD 31.

Incidentally, the surface pinning layer 81 and the side pinning layer 82 may not be formed simultaneously. That is, the second process may include a process similar to a process in the past of forming the surface pinning layer 81 by performing ion implantation from directly above toward the surface of the silicon substrate 61 and a process of forming the side pinning layer 82 by performing ion implantation from an inclined direction with respect to the surface of the silicon substrate 61.

In a third process, the pixel separating section 62 is formed by burying polysilicon in the trench 62'. In addition, in the third process, a gate electrode 71 is formed at a position on the surface of the silicon substrate 61 which position is in a region between the PD 31 and an FD 33.

In a fourth process, a contact part 63 is formed so as to be connected to the pixel separating section 62, and a contact part 72 is formed so as to be connected to the gate electrode 71. Thereafter, ground wiring 64 is formed so as to be connected to the contact part 63, and transfer signal wiring 41 is formed so as to be connected to the contact part 72.

The manufacturing processes as described above can manufacture the pixel 21 in which the surface pinning layer 81 is formed on the surface side of the PD 31 and the side pinning layer 82 is formed so as to surround side surface sides of the PD 31.

In addition, by simultaneously forming PN junctions of the PD 31, the surface pinning layer 81, and the side pinning layer 82 by performing ion implantation from an oblique direction, the PD 31 with a large amount of saturation charge can be formed without increasing the number of processes from that of a manufacturing method in the past.

In the pixel 21, because a PN junction is formed not only on the surface side of the PD 31 but also on the side surface sides of the PD 31, an area for gaining an amount of saturation charge can be increased as compared with the pixel of the structure in the past, and the amount of saturation charge as a whole can be increased.

Figure 6A:
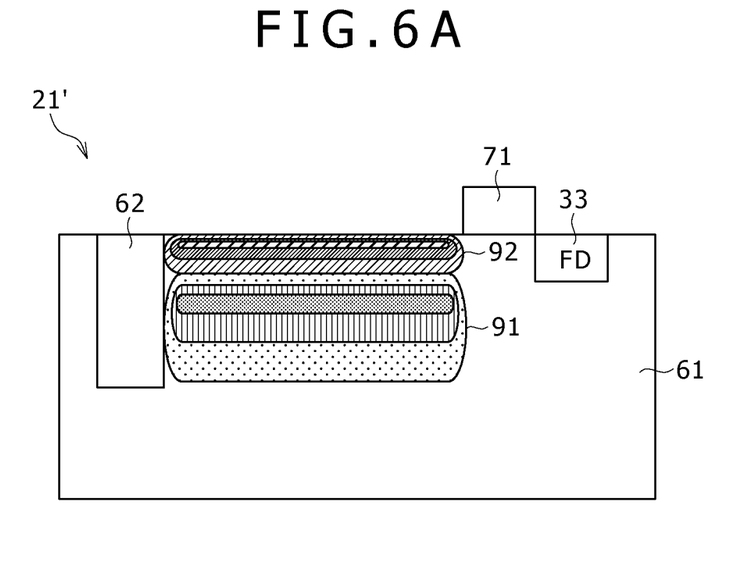
FIGS. 6A and 6B are diagrams of assistance in explaining a comparison with a pixel having a structure in the past.
Figure 6B:
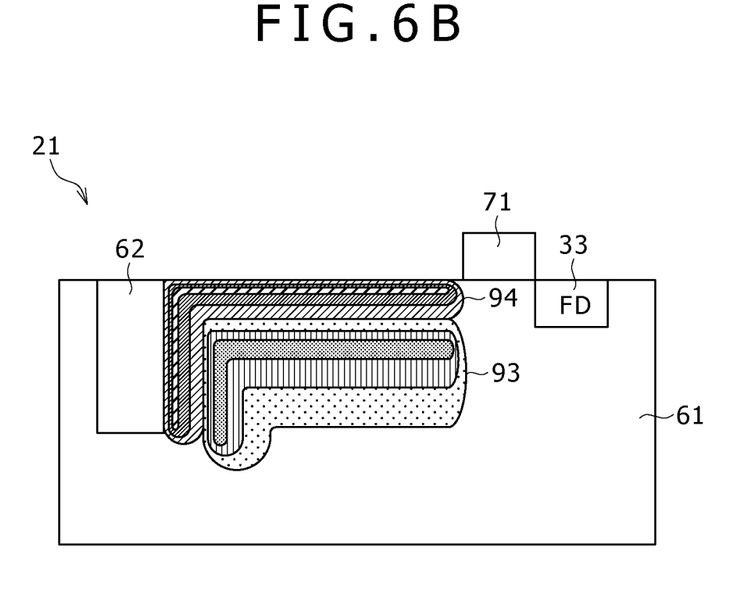

A comparison with the pixel of the structure in the past will be described with reference to FIGS. 6A and 6B. FIG. 6A shows the sectional potential distribution of the pixel 21' of the structure in the past. FIG. 6B shows the sectional potential distribution of the pixel 21 to which the present technology is applied.

In the pixel 21' in the past, a trench is formed in a region in which to form a pixel separating section 62, the pixel separating section 62 is formed by burying polysilicon or oxide film in the trench, and ion implantation is performed to form a PD and a surface pinning layer from the surface side of a silicon substrate 61. Thereby, as shown in FIG. 6A, the potential distribution 91 of the PD and the potential distribution 92 of the surface pinning layer are formed.

On the other hand, in the pixel 21, the trench is formed in the region in which to form the pixel separating section 62, and the side pinning layer 82 is formed by performing ion implantation from the inclined direction with reference to the surface of the silicon substrate 61 in a state of the trench being open. Thereby, as shown in FIG. 6B, the potential distribution 93 of the PD and the potential distribution 94 of the surface pinning layer are formed. That is, a steep PN junction is formed not only in a surface part but also a side part.

Thus, the pixel 21 has a different potential distribution from the pixel 21', and the PD 31 that can accumulate more charge can be formed even with the same pixel area as that of the pixel 21'.

In addition, the side pinning layer 82 in the pixel 21 is formed by performing ion implantation in a state of the trench 62' being open. A steep PN junction can therefore be formed also at the side part of the PD 31 in a similar manner to that of the surface side of the PD 31.

As disclosed in the above-described Patent Document 1, an amount of saturation charge can be increased by forming a PN junction capacitance on the side of a trench element isolation. However, with this structure, the capacitance of a side wall between the PD and the well is formed in a deep part of the silicon substrate. It is therefore assumed to be difficult to form a steep PN junction as between the PD and the surface pinning layer. Therefore, with the structure disclosed in the above-described Patent Document 1, it is assumed to be difficult to improve the saturation charge amount of the PD greatly.

On the other hand, in the pixel 21, the side pinning layer 82 is formed by performing ion implantation for forming the side pinning layer 82 from an oblique direction in a state of the trench 62' being open, rather than performing the ion implantation from the surface side of the silicon substrate 61. It is therefore possible to form a steeper PN junction at the side part of the PD 31 than in the structure disclosed in the above-described Patent Document 1, and improve the saturation charge amount of the PD 31 greatly.

Figure 7:
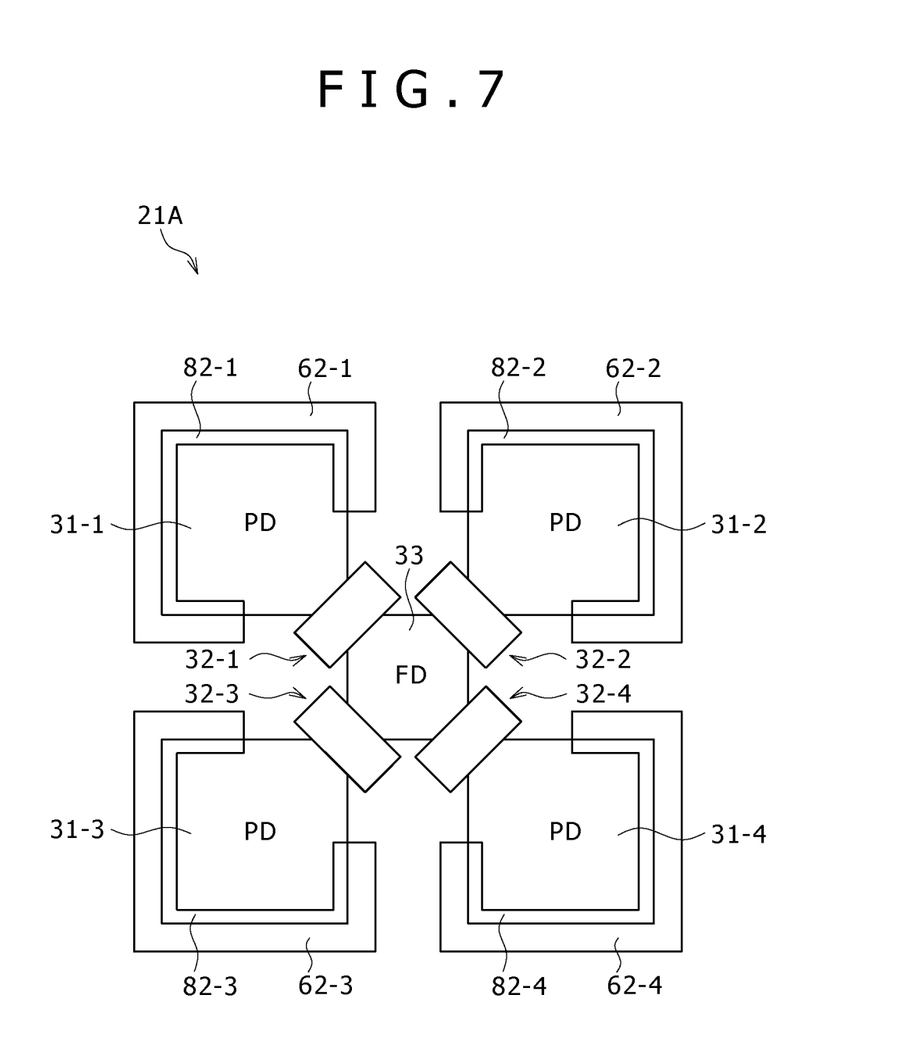
FIG. 7 is a diagram showing a planar structure of a first example of modification of the pixel.

A first example of modification of the pixel 21 will next be described with reference to FIG. 7. FIG. 7 shows a planar structure of a pixel 21A.

As shown in FIG. 7, the pixel 21A adopts a structure in which four PDs 31-1 to 31-4 share one FD 33. As in the pixel 21 in FIG. 4A, also in the pixel 21A, a side pinning layer 82-1 is formed between a PD 31-1 and a pixel separating section 62-1 surrounding sides of the PD 31-1. Side pinning layers 82-2 to 82-4 are similarly formed for the PDs 31-2 to 31-4.

Thus, the pixel 21A can also increase the saturation charge amounts of the PDs 31-1 to 31-4. Further, in the pixel 21A, the PDs 31-1 to 31-4 can be increased in area by sharing the FD 33. This also increases the saturation charge amounts.

Thus, the present technology can be applied to pixels of various structures. That is, the present technology is not limited to the pixel 21 of the structure including the PD 31, the FD 33, and the four transistors (the transfer transistor 32, the amplifying transistor 34, the selecting transistor 35, and the reset transistor 36) as shown in FIG. 2. Further, a structure in which a pixel signal is read out by three transistors, for example, may be adopted as the configuration of the pixel 21.

Figure 8:
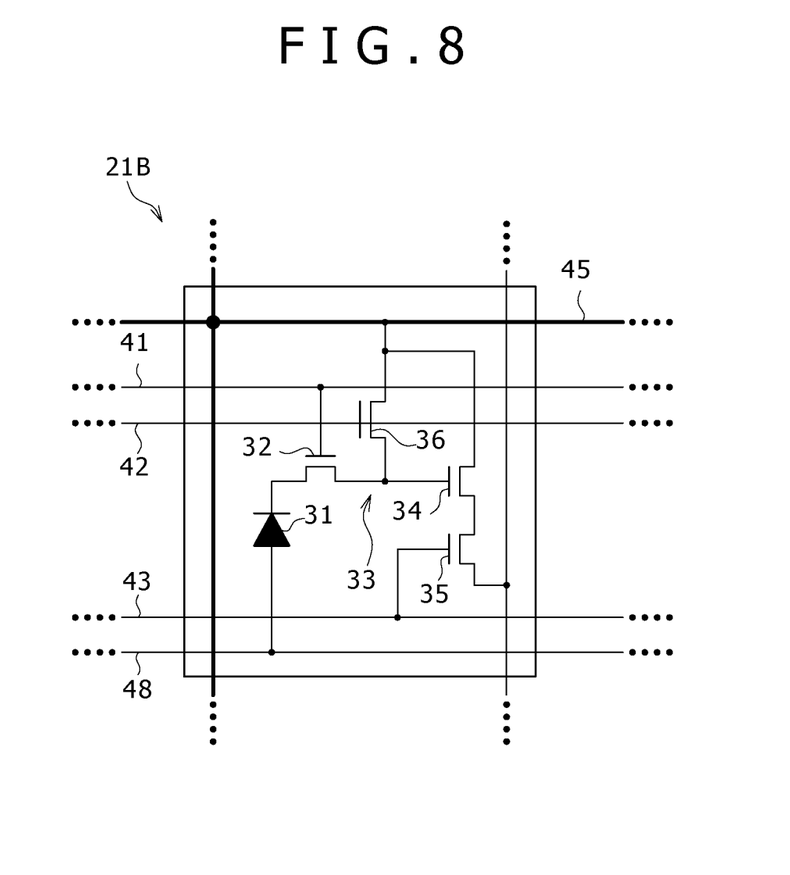
FIG. 8 is a circuit diagram showing a second example of modification of the pixel.

A second example of modification of the pixel 21 will next be described with reference to FIG. 8. FIG. 8 is a circuit diagram of a pixel 21B. In FIG. 8, constituent elements similar to those of the pixel 21 in FIG. 2 are identified by the same reference numerals, and detailed description thereof will be omitted.

The pixel 21B in FIG. 8 has a different configuration from the pixel 21 in that the anode of a PD 31 in the pixel 21B in FIG. 8 is connected to transfer auxiliary signal wiring 48, whereas the anode of the PD 31 in the pixel 21 is grounded. The pixel 21B and the pixel 21 otherwise have a common configuration.

In the pixel 21B, a negative potential is supplied to the anode of the PD 31 via the transfer auxiliary signal wiring 48 in timing in which a charge is transferred from the PD 31 to an FD 33. That is, in the pixel 21B, a negative potential at a GND level or lower is supplied to a pixel separating section 62 (see FIGS. 4A and 4B) surrounding the PD 31 in timing in which a charge is transferred from the PD 31 to the FD 33.

Figure 9:
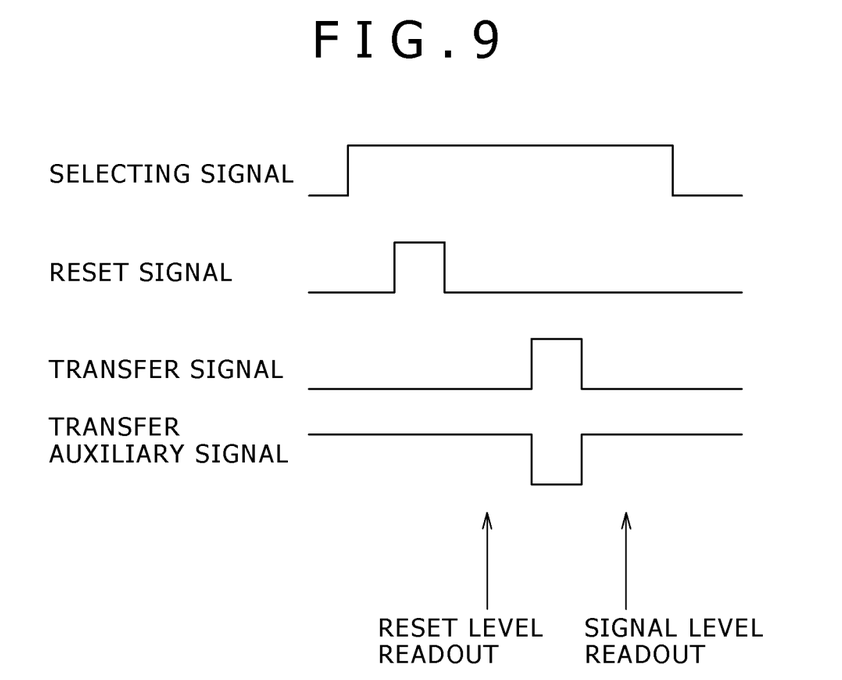
FIG. 9 is a diagram showing an example of driving timing of a pixel.

Specifically, as shown in FIG. 9, as in the case of the driving signals described with reference to FIG. 3, a selecting signal is set to a high level, and a reset signal resets a charge accumulated in the FD 33. Thereafter, a transfer auxiliary signal provides a negative potential in the form of a pulse to the anode of the PD 31 at the same time that a transfer signal is supplied in the form of a pulse.

Such driving can make a potential on the periphery of the PD 31 shallow at a time of charge transfer in the pixel 21B. Thus, a charge accumulated in the PD 31 is carried to the center of the PD 31, so that the charge transfer can be performed more easily.

That is, in the pixel 21, a deep potential part is formed on the periphery of the PD 31, and it is therefore assumed to be difficult to transfer a charge. On the other hand, making the potential on the periphery of the PD 31 shallow at the time of charge transfer as in the pixel 21B can assist in charge transfer, and realize better charge transfer.

Incidentally, in the foregoing embodiment, the pixel separating section 62 is formed by burying polysilicon in the trench 62'. However, for example, the pixel separating section 62 may be formed by burying an oxide film in the trench 62'.

In addition, when the side pinning layer 82 is formed by performing ion implantation in an oblique direction using a mask in separate timing from ion implantation in a direction of depth (on the surface side of the PD 31) in the process of forming the PD 31, a different PN junction from the PN junction in the direction of depth can be formed. Thereby profile controllability for desired characteristics can be improved.

The solid-state imaging element 11 can be included into not only imaging devices such as digital still cameras, digital video cameras, and the like but also various electronic devices such as portable telephone terminals, personal computers, and the like.

Figure 10:
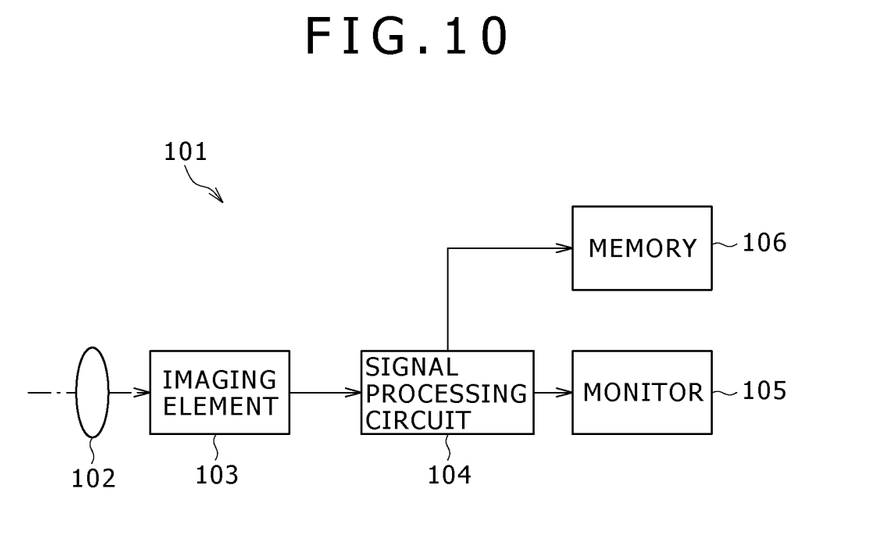
FIG. 10 is a block diagram showing an example of configuration of an imaging device included in an electronic device.

FIG. 10 is a block diagram showing an example of configuration of an imaging device.

As shown in FIG. 10, the imaging device 101 includes an optical system 102, an imaging element 103, a signal processing circuit 104, a monitor 105, and a memory 106. The imaging device 101 can take still images and moving images.

The optical system 102 includes one or a plurality of lenses. The optical system 102 guides image light (incident light) from a subject to the imaging element 103 to make an image formed on the light receiving surface (sensor section) of the imaging element 103.

The solid-state imaging element 11 including the pixel 21 of the above-described configuration is applied as the imaging element 103. The imaging element 103 accumulates electrons for a certain period according to the image formed on the light receiving surface via the optical system 102. Then a signal corresponding to the electrons accumulated in the imaging element 103 is supplied to the signal processing circuit 104.

The signal processing circuit 104 subjects the signal charge output from the imaging element 103 to various kinds of signal processing. An image (image data) obtained by the signal processing of the signal processing circuit 104 is supplied to the monitor 105 and displayed on the monitor 105, or supplied to the memory 106 and stored (recorded) in the memory 106.

Applying the solid-state imaging element 11 having the pixel 21 of the configuration as described above as the imaging element 103 in the thus formed imaging device 101 can suppress a decrease in dynamic range and therefore improve image quality more even when the pixel is miniaturized.

In addition, the solid-state imaging element 11 according to the foregoing embodiment of the present technology can be adopted in a CMOS type solid-state imaging element of a back side illumination type, a CMOS type solid-state imaging element of a front side illumination type, a CCD type solid-state imaging element, and the like.

Incidentally, the present technology can also take the following constitutions:

(1) A solid-state imaging element including:
a pixel having
a photoelectric conversion section formed in a semiconductor substrate, and
a side pinning layer formed on a side of the photoelectric conversion section,
in which the side pinning layer is formed by performing ion implantation in a state of a trench being open, the trench being formed in a part on a side of a region in which the photoelectric conversion section is formed.

(2) The solid-state imaging element according to the above (1),
in which the side pinning layer is formed so as to surround the side of the photoelectric conversion section.

(3) The solid-state imaging element according to the above (1) or (2),
in which the side pinning layer is formed by performing ion implantation from an inclined direction with respect to a surface of the semiconductor substrate.

(4) The solid-state imaging element according to any one of the above (1) to (3), further including a surface pinning layer formed on a surface side of the photoelectric conversion section,
in which the side pinning layer and the surface pinning layer are formed simultaneously by performing ion implantation from an inclined direction with respect to the surface of the semiconductor substrate.

(5) The solid-state imaging element according to any one of the above (1) to (4), in which a pixel separating section for separating from an adjacent pixel is buried in the trench after the side pinning layer is formed.

(6) The solid-state imaging element according to the above (5), in which a negative potential is supplied to the pixel separating section in timing of transfer of a charge accumulated in the photoelectric conversion section.

It is to be noted that the present embodiment is not limited to the foregoing embodiment, but is susceptible of various changes without departing from the spirit of the present disclosure.

The present disclosure contains subject matter related to that disclosed in Japanese Priority Patent Application JP 2011-176721 filed in the Japan Patent Office on Aug. 12, 2011, the entire content of which is hereby incorporated by reference.

What is claimed is:

1. A solid-state imaging element comprising:
a pixel including a photoelectric conversion section formed in a semiconductor substrate of a first conductivity type having a first impurity concentration;
a side pinning layer formed on a side of the photoelectric conversion section, wherein the side pinning layer is formed of the first conductivity type having a higher impurity concentration than the first impurity concentration; and
an anode of the photoelectric conversion section comprising a pixel separating section surrounding sides of the photoelectric conversion section, wherein the pixel separating section comprises at least two sides in contact with the semiconductor substrate of the first conductivity type having the first impurity concentration, and wherein a negative potential is supplied to the anode of the photoelectric conversion section.

2. The solid-state imaging element according to claim 1, wherein the side pinning layer is formed in a region surrounding the side of the photoelectric conversion section.

3. The solid-state imaging element according to claim 1, wherein the side pinning layer is formed by performing ion implantation from an inclined direction with respect to a surface of the semiconductor substrate.

4. The solid-state imaging element according to claim 1, further comprising a surface pinning layer formed on a surface side of the photoelectric conversion section,
wherein the side pinning layer and the surface pinning layer are formed simultaneously by performing ion implantation from an inclined direction with respect to the surface of the semiconductor substrate.

5. The solid-state imaging element according to claim 1, wherein a pixel separating section separating from an adjacent pixel is buried in a trench after the side pinning layer is formed.

6. The solid-state imaging element according to claim 1, wherein the side pinning layer is formed by performing ion implantation in a state of a trench being open, the trench being formed in a part on a side of a region in which the photoelectric conversion section is formed.

7. A method for manufacturing a solid-state imaging element including a pixel comprising:
forming a trench in a semiconductor substrate of a first conductivity type having a first impurity concentration;
forming a photoelectric conversion section in the semiconductor substrate;
forming a side pinning layer on a side of the photoelectric conversion section, wherein the side pinning layer is formed of the first conductivity type having a higher impurity concentration than the first impurity concentration;
forming a surface pinning layer on a surface side of the photoelectric conversion section;
forming an anode of the photoelectric conversion section, wherein the anode comprises a pixel separating section formed in the trench and surrounding sides of the photoelectric conversion section the pixel separating section comprising at least two sides in contact with the semiconductor substrate of the first conductivity type having the first impurity concentration; and
connecting an anode of the photoelectric conversion section to a signal wiring such that a negative potential is supplied to the photoelectric conversion section.

8. The method for manufacturing a solid-state imaging element according to claim 7, further comprising forming the side pinning layer in a region surrounding the side of the photoelectric conversion section.

9. The method for manufacturing a solid-state imaging element according to claim 7, further comprising forming the side pinning layer by performing ion implantation from an inclined direction with respect to a surface of the semiconductor substrate.

10. The method for manufacturing a solid-state imaging element according to claim 7, wherein the side pinning layer and the surface pinning layer are formed simultaneously by performing ion implantation from an inclined direction with respect to the surface of the semiconductor substrate.

11. The method for manufacturing a solid-state imaging element according to claim 7, further comprising burying the pixel separating section in the trench after forming the side pinning layer.

12. The method for manufacturing a solid-state imaging element according to claim 7, further comprising forming the side pinning layer by performing ion implantation when a trench is open, the trench being formed in a part on a side of a region in which the photoelectric conversion section is formed and including the pixel separating section.

13. An electronic device comprising:
a solid-state imaging element including a pixel having a photoelectric conversion section formed in a semiconductor substrate of a first conductivity type having a first impurity concentration;
a side pinning layer formed on a side of the photoelectric conversion section, wherein the side pinning layer is formed of the first conductivity type having a higher impurity concentration than the first impurity concentration; and
an anode of the photoelectric conversion section comprising a pixel separating section surrounding sides of the photoelectric conversion section, wherein the pixel separating section comprises at least two sides in contact with the semiconductor substrate of the first conductivity type having the first impurity concentration, and wherein a negative potential is supplied to the anode of the photoelectric conversion section.

14. The electronic device according to claim 13, wherein the side pinning layer is formed in a region surrounding the side of the photoelectric conversion section.

15. The electronic device according to claim 13, wherein the side pinning layer is formed by performing ion implantation from an inclined direction with respect to a surface of the semiconductor substrate.

16. The electronic device according to claim 13, further comprising a surface pinning layer formed on a surface side of the photoelectric conversion section,
    wherein the side pinning layer and the surface pinning layer are formed simultaneously by performing ion implantation from an inclined direction with respect to the surface of the semiconductor substrate.

17. The electronic device according to claim 13, wherein the side pinning layer is formed by performing ion implantation when the trench is open, the trench being formed in a part on a side of a region in which the photoelectric conversion section is formed.

18. The electronic device according to claim 13,
    wherein the pixel separating section separating the pixel from an adjacent pixel is buried in a trench after the side pinning layer is formed.

19. The electronic device according to claim 18,
    wherein a negative potential is supplied to the pixel separating section in timing of transfer of a charge accumulated in the photoelectric conversion section.

* * * * *